United States Patent
Oshima et al.

(10) Patent No.: US 6,628,526 B1
(45) Date of Patent: Sep. 30, 2003

(54) ELECTRONIC DEVICE MANUFACTURING METHOD, ELECTRONIC DEVICE AND RESIN FILLING METHOD

(75) Inventors: Gosuke Oshima, Tamamura-machi (JP); Masashi Miki, Omiya (JP)

(73) Assignee: Taiyo Yuden Co., Ltd., Gunma-Gun (JP)

( * ) Notice: Subject to any disclaimer, the term of this patent is extended or adjusted under 35 U.S.C. 154(b) by 0 days.

(21) Appl. No.: 09/614,374

(22) Filed: Jul. 12, 2000

(30) Foreign Application Priority Data

Jul. 13, 1999 (JP) ............................................ 11-198987

(51) Int. Cl.[7] ................................................ H05K 5/02
(52) U.S. Cl. ...................... 361/760; 361/818; 257/789; 257/790; 257/795; 174/52.2
(58) Field of Search ................................ 361/760, 773, 361/774, 783, 818; 257/687, 787, 788, 789, 790, 795; 174/52.2

(56) References Cited

U.S. PATENT DOCUMENTS

| | | | |
|---|---|---|---|
| 5,043,211 A | * 8/1991 | Yoshizumi et al. | 174/52.2 |
| 5,122,860 A | * 6/1992 | Kikuchi et al. | 257/679 |
| 5,455,384 A | * 10/1995 | Ichihara | 174/52.2 |
| 5,612,513 A | * 3/1997 | Tuttle et al. | 174/260 |
| 5,631,809 A | * 5/1997 | Takagi et al. | 174/35 R |
| 5,635,669 A | * 6/1997 | Kubota et al. | 174/52.1 |
| 5,694,300 A | * 12/1997 | Mattei et al. | 174/35 R |
| 5,822,194 A | * 10/1998 | Horiba et al. | 174/250 |
| 5,847,930 A | * 12/1998 | Kazle | 174/52.2 |
| 5,966,294 A | * 10/1999 | Harada et al. | 174/250 |
| 6,365,979 B1 | * 4/2002 | Miyajima | 257/787 |

* cited by examiner

Primary Examiner—John B. Vigushin
(74) Attorney, Agent, or Firm—Fish & Neave; Norman H. Beamer; Vinay V. Joshi

(57) ABSTRACT

The present invention provides an electronic device manufacturing method and an electronic device which make it possible to reduce the waste of materials and the number of manufacturing steps required. Electronic devices are manufactured via a process including creating a collective substrate, in which a plurality of substrates corresponding to the electronic devices being manufactured are connected in the form of a matrix, mounting electronic parts on the upper surface of the collective substrate, forming a solidified resin layer using a vacuum printing method so that said resin layer covers the upper surface of the collective substrate on which the aforementioned parts have been mounted, or an intermediate layer consisting of an insulating elastic material, and so that said resin layer covers the electronic parts, and separating the collective substrate on which the abovementioned resin layer has been formed into individual substrates. Since a collective substrate is used and electronic devices are obtained by ultimately separating this collective substrate, the waste of substrate material can be greatly reduced, and the number of manufacturing steps required can also be reduced.

8 Claims, 12 Drawing Sheets

ELECTRONIC DEVICE MANUFACTURING METHOD, ELECTRONIC DEVICE AND RESIN FILLING METHOD

FIELD OF THE INVENTION

The present invention relates to (a) an electronic device manufacturing method and an electronic device which eliminates waste of materials and unnecessary manufacturing processes, and (b) a resin filling method in which a target region enveloping electronic parts is filled with a resin.

BACKGROUND OF THE INVENTION

In the past, there has been a rapid spread of compact electronic devices in which a plurality of electronic parts are mounted on a substrate. Electronic devices of this type include devices which are sealed or molded by means of a resin as in the case of ICs and hybrid modules, or the like. Electronic devices of this type also includes devices which are accommodated in a metal case or in which the electronic parts are covered by a metal case.

In the manufacture of such electronic devices, substrates have been prepared for individual electronic devices, and electronic parts have been mounted on these substrates, after which sealing or molding using a resin, or the mounting of a metal case, had been performed.

PROBLEMS TO BE SOLVED BY THE INVENTION

The following problems are encountered in manufacturing the above-mentioned electronic devices.

First of all, in the case of devices that are resin-sealed or molded by means of a resin, since there are indentations and projections on the surfaces of the electronic devices, the electronic devices may fall from the suction chucking machine and suction chucking is difficult to accomplish when the devices are mounted on motherboards using a suction chucking type automatic mounting machine.

Secondly, in the case of electronic devices that use a metal case, although such devices are superior in that they can be shielded from electromagnetic fields and the electronic parts on the substrate can be protected, a process in which metal cases are mounted on the individual substrates is required, and this is an obstacle to the reduction of manufacturing costs.

Thirdly, since compact substrates are formed for individual electronic devices, and the work of mounting electronic parts on these substrates is automated using machinery, extra parts must be provided in order to fasten the individual substrates in place during shipping and part mounting operations, so that a waste of substrate material is generated. Such extra parts used to fasten individual substrates in place are generally called "fastening parts" or "ears" by persons familiar with the art. The electronic devices are ultimately shipped as finished products after these "fastening parts" or "ears" have been cut off and discarded.

Fourth, it is extremely difficult to accomplish resin sealing of a single electronic part mounted on a substrate in isolation from the area surrounding said electronic part. In the past, therefore, considering ease of manufacturing, the entire electronic part has been resin-sealed, or resin sealing has been performed with the electronic parts surrounding the target electronic part included, even in cases where only a single electronic part requires resin sealing. This has resulted in a waste of sealing resin.

In light of the above problems, the object of the present invention is to provide an electronic device manufacturing method and an electronic device which make it possible to (1) reduce the waste of materials, (2) reduce the number of manufacturing steps, and (3) limit resin sealing to a specified target region.

SUMMARY OF THE INVENTION

A. In order to achieve the above-mentioned objects, the present invention proposes a method for manufacturing an electronic device which has a substrate, electronic parts that are mounted on the main surface of said substrate, and a resin part that is formed on the main surface of the aforementioned substrate so that said resin part fills a specified space surrounding at least one electronic part, said electronic device manufacturing method comprising a step in which a collective substrate consisting of a plurality of substrates linked in the form of a matrix is formed, a step in which electronic parts are mounted on the main surface of the aforementioned collective substrate, a step in which the aforementioned resin part which is solidified so that it covers the aforementioned electronic parts is formed on the main surface of the collective substrate on which the aforementioned electronic parts have been mounted, and a step in which the collective substrate on which the aforementioned resin part has been formed is separated into individual substrates.

B. Additional benefits can be obtained by adding to the method described in the previous paragraph a step in which terminal electrode members are conductively connected and mounted across specified adjacent substrates on the upper surface of the collective substrate prior to the formation of the aforementioned resin part, so that these terminal electrode members cross the boundary lines of the adjacent substrates. The aforementioned resin part is formed to a specified thickness over the entire main surface of the collective substrate during the step in which the resin part is formed, and the terminal electrode members are cut in the step in which the collective substrate on which the aforementioned resin part has been formed is separated into individual substrates.

C. The aforementioned terminal electrode members are cut in the step in which the aforementioned collective substrate is separated into individual substrates; accordingly, the cut surfaces of the terminal electrode members are exposed at the cut surfaces of the aforementioned resin part, so that the terminal electrode members can be used as terminal electrodes. As a result, working of the terminal electrodes can easily be accomplished, and electronic devices manufactured by this method can be mounted with the side surfaces of said devices, i.e., the aforementioned cut surfaces, facing the motherboard. In addition, an intermediate layer consisting of an insulating elastic material can be formed on the main surface of the collective substrate (on which the aforementioned electronic parts have been mounted) prior to the formation of the resin part, so that said intermediate layer covers the electronic parts. This intermediate layer alleviates stresses generated by thermal expansion. Differences in the thermal expansion coefficients of the substrate, solder and resin part are alleviated by the intermediate layer.

D. Furthermore, in the methods described above, it is possible to use a vacuum printing method to form the resin part, so that a resin part having a specified thickness is formed over the entire main surface of the collective substrate. The use of a vacuum printing method allows formation of a resin part without any gaps around the electronic parts. Vacuum printing can be accomplished, for example, using Vacuum Printing Encapsulation Systems such as are available from Japan Rec. Co. LTD. of Takatsuki-shi, Osaka, Japan.

E. Furthermore, it is possible to dispose a resin in a vacuum state in a region which includes at least one of the aforementioned electronic parts on the main surface of the aforementioned substrate and a specified space surrounding said electronic part, in isolation from other regions, and a step in which a further resin layer is subsequently formed on the surface of the aforementioned resin part in either a non-vacuum state or vacuum state. The further resin layer is formed on the surface of the resin part which, having been formed using a vacuum printing method, is evened out. Electronic devices manufactured in this way can easily be mounted on a motherboard using a suction chucking type automatic mounting machine.

F. An additional step can be added to the methods discussed above in which at least one layer selected from a set consisting of a heat-dissipating layer, an electromagnetic field shielding layer and a metal layer is formed in a specified region on the surface of the resin part following the formation of the resin part. The electromagnetic field shielding layer or metal layer formed on the surface of the resin part blocks electromagnetic fields. Accordingly, the formation of an electromagnetic field shielding film can easily be accomplished. Furthermore, the aforementioned electromagnetic field shielding film also shows an effect in EMC countermeasures. Moreover, the heat transmitted through thermally conductive members is transmitted to the heat-dissipating layer or metal layer, and is efficiently dissipated in accordance with the surface area of this layer, so that an electronic device with a high heat-dissipating effect can easily be manufactured.

G. Furthermore, the electromagnetic field shielding layer can be formed using a resin in which at least one substance selected from a set consisting of a ferrite filler and a metal filler is dispersed. Accordingly, the electromagnetic field shielding layer can easily be formed.

H. Furthermore, the resin part can be formed using an insulating resin.

I. Furthermore, the resin part can be formed using a resin in which at least one substance selected from a set consisting of a ferrite filler and a metal filler is dispersed. This allows the resin part itself to become an electromagnetic field shielding layer.

J. Furthermore, the resin part can be formed using a material that has waterproof properties. This allows a wet-type cutting device to be used in the process in which the collective substrate is separated into individual substrate units.

K. Furthermore, when manufacturing an electronic device according to the present invention, the resin part of a specified thickness can be formed over the entire main surface of the collective substrate in the step in which the resin part is formed, and the collective substrate can be cut using a dicing device in the process in which the collective substrate on which the resin part has been formed is separated into individual substrates. The use of a dicing machine allows cutting to be accomplished very simply and with clean cut surfaces.

L. Furthermore, according to the present invention, an electronic device is proposed which comprises a substrate, electronic parts that are mounted on the main surface of said substrate, a resin part that is formed on the main surface of the aforementioned substrate so that said resin part fills a specified space surrounding the aforementioned electronic parts, and terminal electrodes that are exposed to the outside. This electronic device can be easily manufactured using a collective substrate in which a plurality of substrates on which electronic parts protected by a resin are connected in the form of a matrix.

M. The proposed electronic device can have an intermediate layer consisting of an insulating elastic material which is formed on the main surface of the substrate so that said intermediate layer fills a specified space surrounding the electronic parts. In this electronic device, stresses generated by thermal expansion and differences in the thermal expansion coefficients of the aforementioned substrate, solder and resin part are alleviated by the elastic material constituting the intermediate layer.

N. Furthermore, the proposed electronic device can have a substrate in the shape of a rectangular solid with a specified thickness. If the substrate has the shape of a rectangular solid with a specified thickness, manufacture using a matrix-form collective substrate can be easily accomplished.

O. Furthermore, in the proposed electronic device, the resin part can have the shape of a rectangular solid that is formed to a specified thickness over the entire main surface of the substrate, where the side surfaces of the resin part are positioned in the same planes as the side surfaces of the substrate. This allows the electric device to be mounted with the side surfaces of the substrate and resin part facing the motherboard.

P. Furthermore, in the proposed electronic device the resin part can have the shape of a rectangular solid formed over the entire main surface of the substrate, the terminal electrodes can be embedded in the resin part, and the end surfaces of said terminal electrodes can be exposed in the same plane as at least one of the side surfaces of the resin part and/or surface of the resin part that is parallel to the main surface of the substrate. If the terminal electrodes are exposed at the side surfaces, surface mounting with the side surfaces facing the motherboard can easily be accomplished, and the direction of mounting can easily be confirmed as a result of the exposed positions of the terminal electrodes. Furthermore, if the terminal electrodes are exposed at the surface that is parallel to the main surface of the substrate, the electric device can be mounted on or connected to a connector, or the like.

Q. Furthermore, in the proposed electronic device the resin part can consist of a resin in which at least one substance selected from a set consisting of a ferrite filler and a metal filler is dispersed. In this electronic device, the resin layer can be formed easily and in the desired shape at the time of manufacture; furthermore, the resin part has a heat-dissipating function and an electrostatic shielding or electromagnetic shielding function. Furthermore, in the proposed electronic device the resin part can consist of a resin which has at least one type of property selected from a set consisting of insulating properties, heat resistance, waterproof properties and chemical resistance.

R. In this electronic device, in cases where an insulating resin is used in the resin part, the main surface of the substrate and the electronic parts can be insulated from each other, and in cases where a heat-resistant resin is used in the resin part, the electronic parts can be protected from external heat. In cases where a waterproof resin is used in the resin part, the adhesion of moisture to the electronic parts is prevented by the resin part, and in cases where a chemical-resistant resin, e. g., an alkali-resistant, acid-resistant or corrosion-resistant resin, is used in the resin part, the electronic parts are protected by the resin part when such chemicals adhere to the electronic parts.

S. Furthermore, in the proposed electronic device at least one layer selected from a set consisting of an electromagnetic field shielding layer, a heat-dissipating layer and a metal layer can be formed in a specified region on the surface of the resin part. If this is done, electromagnetic fields are blocked by the above-mentioned electromagnetic field shielding layer or metal layer, and heat generated by the electronic parts can be efficiently dissipated by the above-mentioned heat-dissipating layer or metal layer.

T. Furthermore, according to the present invention, a resin filling method is proposed in which a specified space around electronic parts mounted on the main surface of a substrate, or the surface of an intermediate layer, is filled with a resin. This resin filling method is characterized by the fact that after at least the area around the aforementioned electronic parts is set in a vacuum state, a resin which possesses viscosity is disposed so that said resin envelops the electronic parts in the aforementioned region place. The resin is disposed so that it contacts the main surface of the substrate or surface of the intermediate layer at least in the area surrounding the aforementioned electronic parts. Then the aforementioned vacuum state is then released so that a non-vacuum state results. In this resin filling method, even if a gap should occur between the aforementioned electronic parts and the resin or between the electronic parts and the main surface of the substrate in a state in which the resin is disposed in the area surrounding the electronic parts, the interior of this gap is in a vacuum state. Accordingly, when the space outside the aforementioned resin which is in a vacuum state is placed in a non-vacuum state, the aforementioned gap will be filled with the resin as a result of the air pressure.

BRIEF DESCRIPTION OF THE DRAWINGS

The above and other objects and advantages of the present invention will be apparent upon consideration of the following detailed description, taken in conjunction with the accompanying drawings, in which.

DETAILED DESCRIPTION OF THE INVENTION

Preferred embodiments of the present invention will be described below with reference to the drawings.

Figure 1:
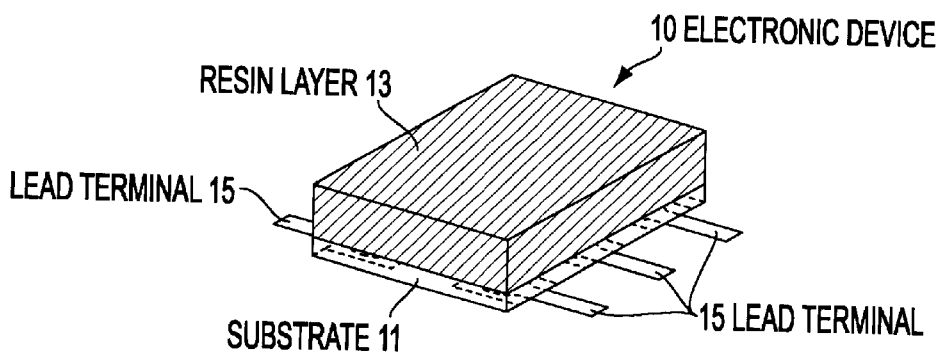
FIG. 1 is an external perspective view which illustrates an electronic device in a first embodiment of the present invention.
Figure 2:
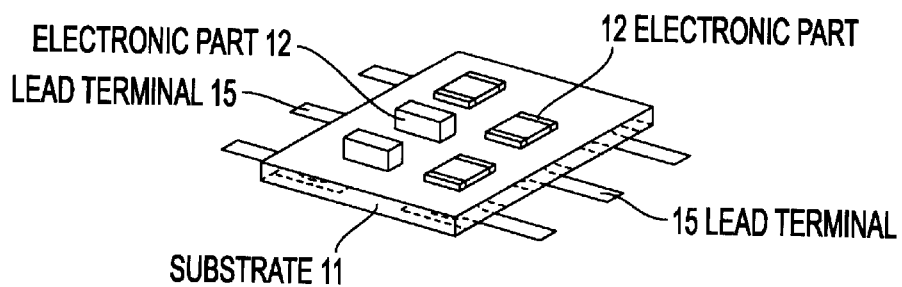
FIG. 2 is an external perspective view which shows the above-mentioned electronic device in the first embodiment of the present invention with the resin layer removed.
Figure 3:
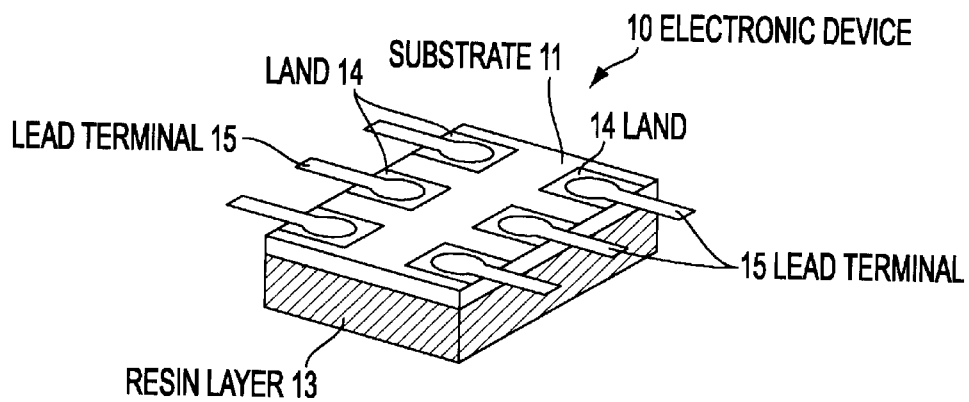
FIG. 3 is an external perspective view which shows the above-mentioned electronic device in the first embodiment of the present invention with the bottom surface of the device on top.

FIG. 1 is an external perspective view which illustrates an electronic device in one embodiment of the present invention. FIG. 2 is an external perspective view of the same with the resin layer removed. FIG. 3 is an external perspective view of the same with the bottom surface on top. In the figures, 10 indicates an electronic device which has the shape of a rectangular solid with a specified thickness (e. g., a thickness of 4 mm). This electronic device 10 is constructed from a substrate 11 on which printed wiring is formed, a plurality of electronic parts 12 which are mounted on the part mounting surface (one of the main surfaces, i.e., the upper surface) of the substrate 11, a resin layer (resin part) 13 which is formed on the upper surface of the substrate 11 so that it covers the electronic parts 12, and a plurality of lead terminals 15 which are mounted on the undersurface of the substrate 11.

The substrate 11 consists of (for example) a ceramic substrate with a thickness of 1 mm whose upper surface has a rectangular shape. Lands (not shown in the figures) used for the mounting of parts are formed on the upper surface of the substrate 11, and lands 14 used for the connection of the lead terminals 15 are formed along two opposite sides of the substrate 11 on the undersurface of the substrate 11, with three lands 14 being formed on each side. Here, six lands 14 are formed, and lead terminals 15 are connected to these respective lands 14. Here, furthermore, the lead terminals 15 are soldered so that they protrude from the side surfaces of the substrate 11 in a direction perpendicular to the sides of the substrate 11. Furthermore, of the six lead terminals 15, three lead terminals are used as GND terminals, one is used as a power supply terminal, one is used as a signal input terminal, and one is used as a signal output terminal.

For example, the resin layer 13 consists of a thermosetting resin or ultraviolet-curable resin which has insulating properties, waterproof properties or heat resistance. A resin with chemical resistance, e. g., a resin with alkali resistance, acid resistance or corrosion resistance, such as a resin of the type used in batteries in order to prevent chemical changes caused by leaking of the electrolyte solution, etc., may also be used. Furthermore, a resin containing (for example) a ferrite filler may also be used. Furthermore, the substrate 11 is not limited to a ceramic substrate; a glass-epoxy substrate, paper-epoxy substrate or paper-phenol substrate, etc., may also be used.

Figure 4:
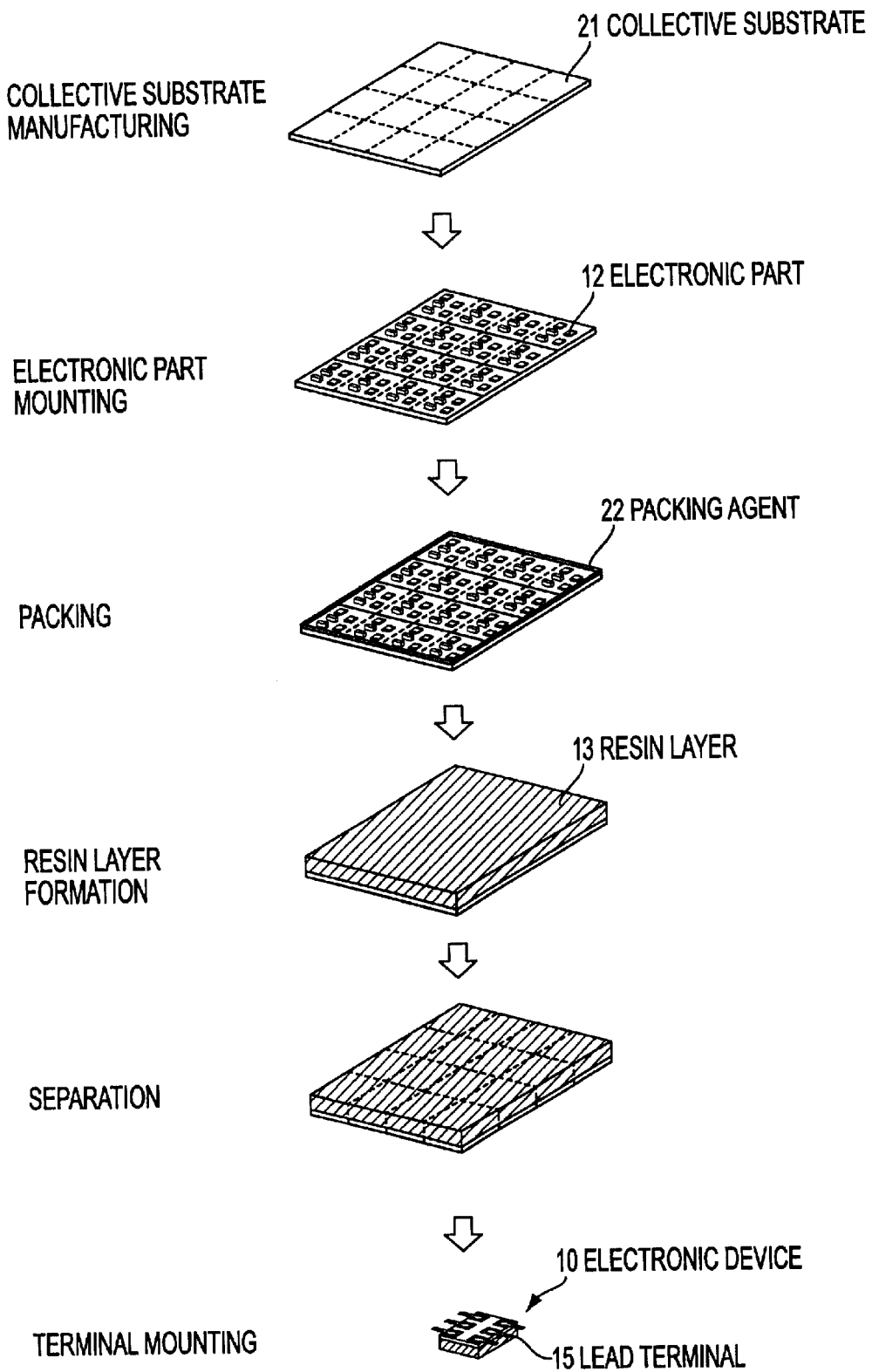
FIG. 4 is a process explanatory diagram which illustrates the method used to manufacture the above-mentioned electronic device in the first embodiment of the present invention.

Next, the method used to manufacture the aforementioned electronic device 10 will be described with reference to the explanatory diagrams shown in FIG. 4.

First, a collective substrate 21 in which the substrates 11 of a plurality of electronic devices 10 are connected in the form of a matrix is formed (collective substrate manufacturing process). Here, a collective substrate 21 in which 16 substrates 11 are arranged in the form of a 4×4 matrix is formed.

Next, after electronic parts 12 have been mounted on the upper surface of this collective substrate 21 (electronic part mounting process), the upper surface of the collective substrate 21 is coated with a packing agent 22 so that the electronic parts 12 are covered (packing process). Here, the packing agent 22 is applied as a coating for purposes of insulation, waterproofing and protection; examples of materials that can be used as this packing agent 22 include coating materials such as acrylic type, urethane type, silicone type, fluorine type, rubber type, vinyl type, polyester type, phenol type, epoxy type and wax type coating materials, etc.

Figure 5:
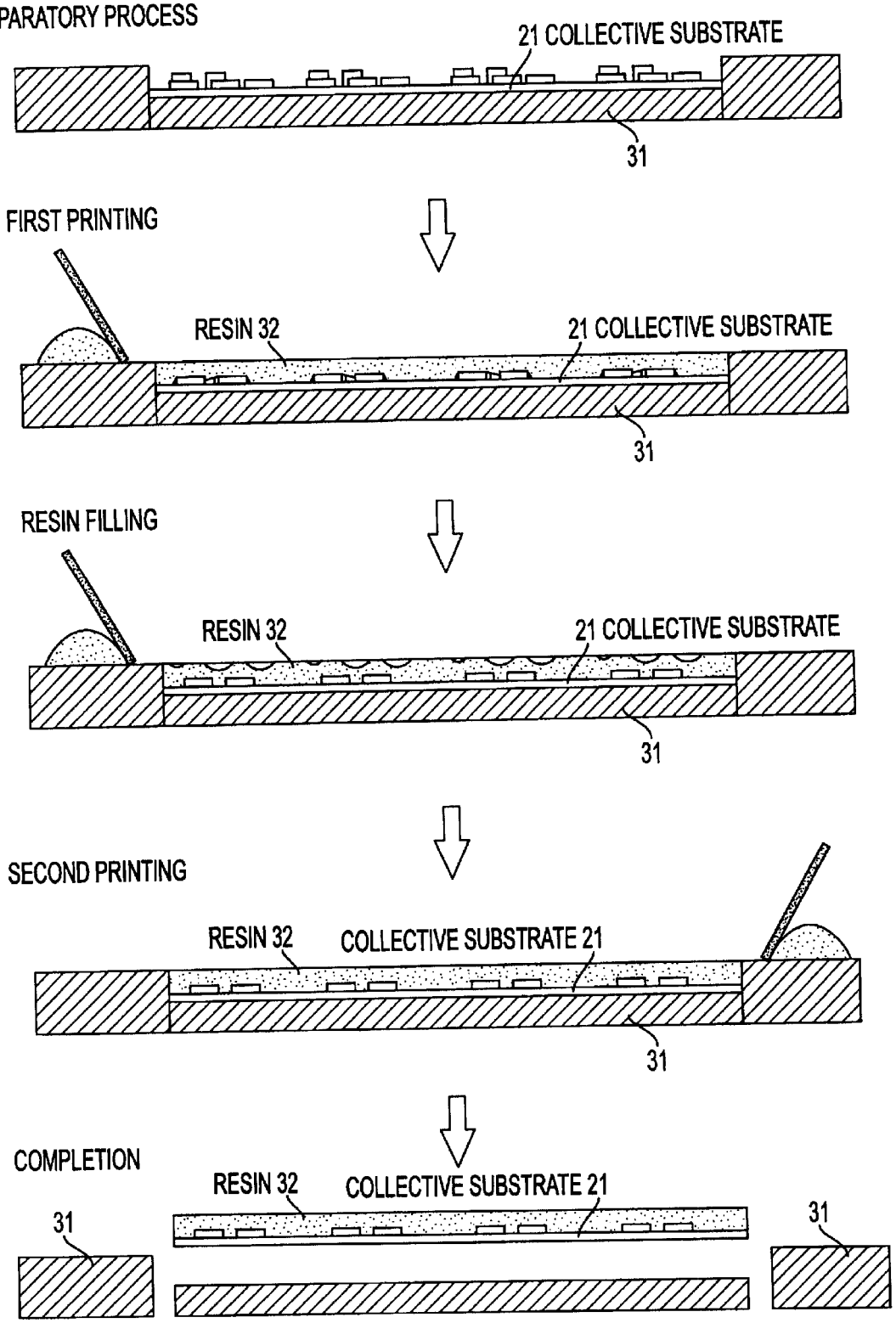
FIG. 5 is a diagram which illustrates the resin layer formation process used in the first embodiment of the present invention.

Afterward, a resin layer 13 is formed on the upper surface of the collective substrate 21 using a vacuum printing method (resin layer formation process). As is shown in FIG. 5, the formation of the resin layer 13 by a vacuum printing method is accomplished as follows: first, the collective substrate 21 is mounted in a stand 31 in which the collective substrate 21 can be accommodated in a horizontal state, and defoaming is performed by placing the substrate under a vacuum of 5 Torr (preparatory process). Next, a resin is supplied by printing the aforementioned resin 32 on the upper surface of the collective substrate 21 (first printing process). In this state, bubble-form spaces are usually formed in the areas around the electronic parts 12 on the collective substrate 21.

Afterward, a differential pressure is generated by increasing the degree of vacuum to (e. g.) approximately 150 Torr, so that the spaces around the above-mentioned electronic parts 12 are filled with the resin (resin filling process). As a result, sinks are formed in the surface of the resin 32; accordingly, the resin 32 is again printed in a non-vacuum state (with the vacuum released) in order to fill the above-mentioned sinks (second printing process).

Next, after the resin 32 is cured, the collective substrate 21 is removed from the stand 31, and the resin layer formation process is completed. Besides the above-mentioned resins, a resin containing a metal filler may also be used as the material of the resin layer 13 formed on the surface of the packing agent 22.

Next, the collective substrate 21 on which the resin layer 13 has been formed is cut using a dicing device. In this case, the main bodies of the electronic devices 10 are obtained by cutting the collective substrate 21 in matrix form along the boundary lines between the individual substrates 11 (separation process). When cutting is thus performed using a dicing device, the cut surfaces are extremely smooth surfaces, so that adjustments such as flash removal, etc., can be accomplished at the same time. Furthermore, since the resin layer 13 has waterproof properties, a wet type cutting method can also be used. Here, the term "main body of the electronic device 10" refers to an electronic device on which lead terminals 15 have not yet been mounted.

Afterward, the lead terminals 15 are connected to the main bodies of the electronic devices 10, thus completing the electronic devices 10. It is desirable that the connection of the lands 14 of the substrate 11 and the lead terminals 15 be accomplished using a high-melting-point solder. It is sufficient if the melting point of this high-melting-point solder is higher than the melting point of the solder used for the mounting of the electronic device 10 on the motherboard. The use of such a high-melting-point solder ensures that the lead terminals 15 will not come loose during the soldering of the electronic device 10 to the motherboard, so that unsatisfactory connections can be prevented.

Since a collective substrate 21 in which a plurality of substrates are connected in the form of a matrix is used in the manufacturing method of the aforementioned first embodiment, the waste of substrate materials seen in conventional examples can be greatly reduced.

Furthermore, since the resin layer 13 is formed in the state of the aforementioned collective substrate 21, and since adjustments such as flash removal and the like, can be performed simultaneously with the separation of the collective substrate 21, the number of steps required can be reduced compared to when manufacture is performed using individual substrates instead of a collective substrate. Furthermore, in cases where the resin layer 13 is formed using a transfer molding technique, which is a universally known resin sealing technique, a number of drawbacks are encountered: e. g., a mold is required, a pressing machine is required, flashes are formed on the sealed products, and air is entrapped so that voids (bubbles) tend to be formed during sealing. However, all of these drawbacks can be eliminated by using a vacuum printing technique.

Furthermore, since the resin layer 13 is formed by a vacuum printing method, the resin layer 13 can be formed without any gaps in the areas surrounding the electronic parts 12, so that the durability of the electronic device 10 can be increased.

Moreover, since the resin layer 13 is formed by a vacuum printing method, the surface of the resin layer 13 can be formed as a flat surface; accordingly, suction chucking by means of an automatic mounting machine can be easily accomplished.

Furthermore, in cases where packing is applied, the insulation resistance can be increased even in cases where the resin layer 13 is formed using a resin that contains a metal filler.

Moreover, in the packing process, the above-mentioned packing agent 22 may be sprayed or applied with a brush, etc.; alternatively a film may be pasted to the surface. Furthermore, sufficient durability can be obtained even if a coating of the packing agent 22 is not applied.

Furthermore, in the embodiment described above, a dicing device was used to cut the collective substrate. However, the present invention is not limited to this; it would also be possible to cut the collective substrate into respective substrates by means of a laser, water or wire, etc. In this case, the shape of the substrate may be round, triangular or some other polygonal shape, or the shape may be flexibly adjusted to match the case that accommodates the electronic device of the present invention.

Furthermore, in this embodiment, there are no particular limits on the function of the electronic device 10; the present invention can be applied to various types of electronic devices. For example, the present invention can be applied to manufacture of electronic devices including high-frequency power amplifiers, electronic volumes, DC/DC converters, FET switches, low-power telemeters, keyless transmitters and inverters, etc.

Next, a second embodiment of the present invention will be described.

Figure 6:
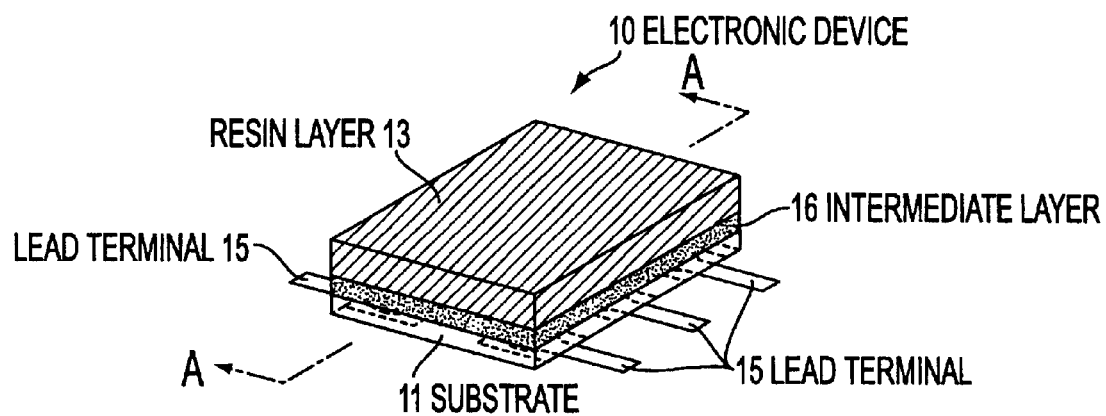
FIG. 6 is an external perspective view which illustrates an electronic device in a second embodiment of the present invention.
Figure 7:
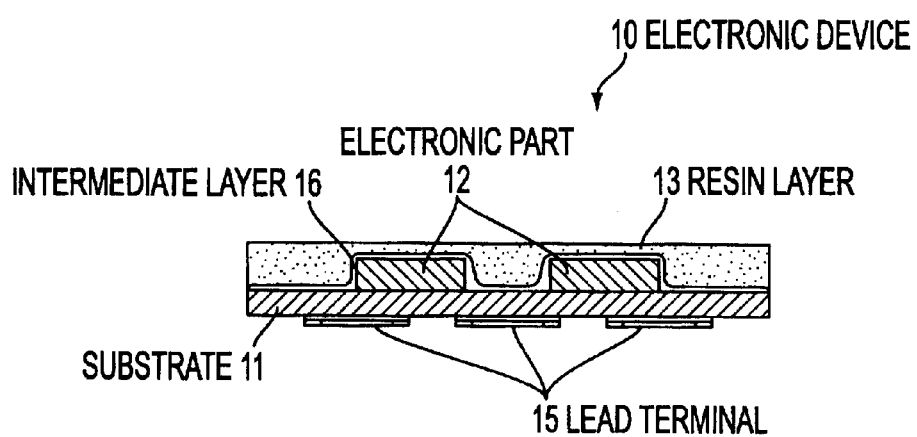
FIG. 7 is a sectional view in the direction indicated by the arrow along line A—A in FIG. 6.

FIG. 6 is an external perspective view of an electronic device in a second embodiment of the present invention, and FIG. 7 is a sectional view in the direction indicated by the arrow along line A—A in FIG. 6.

The intermediate layer 16 consists of an elastic material which has insulating properties, such as silicon or a rubber, etc. This intermediate layer 16 is formed so that it covers the upper surface of the substrate 11 and the surfaces of the electronic parts 12.

Figure 8:
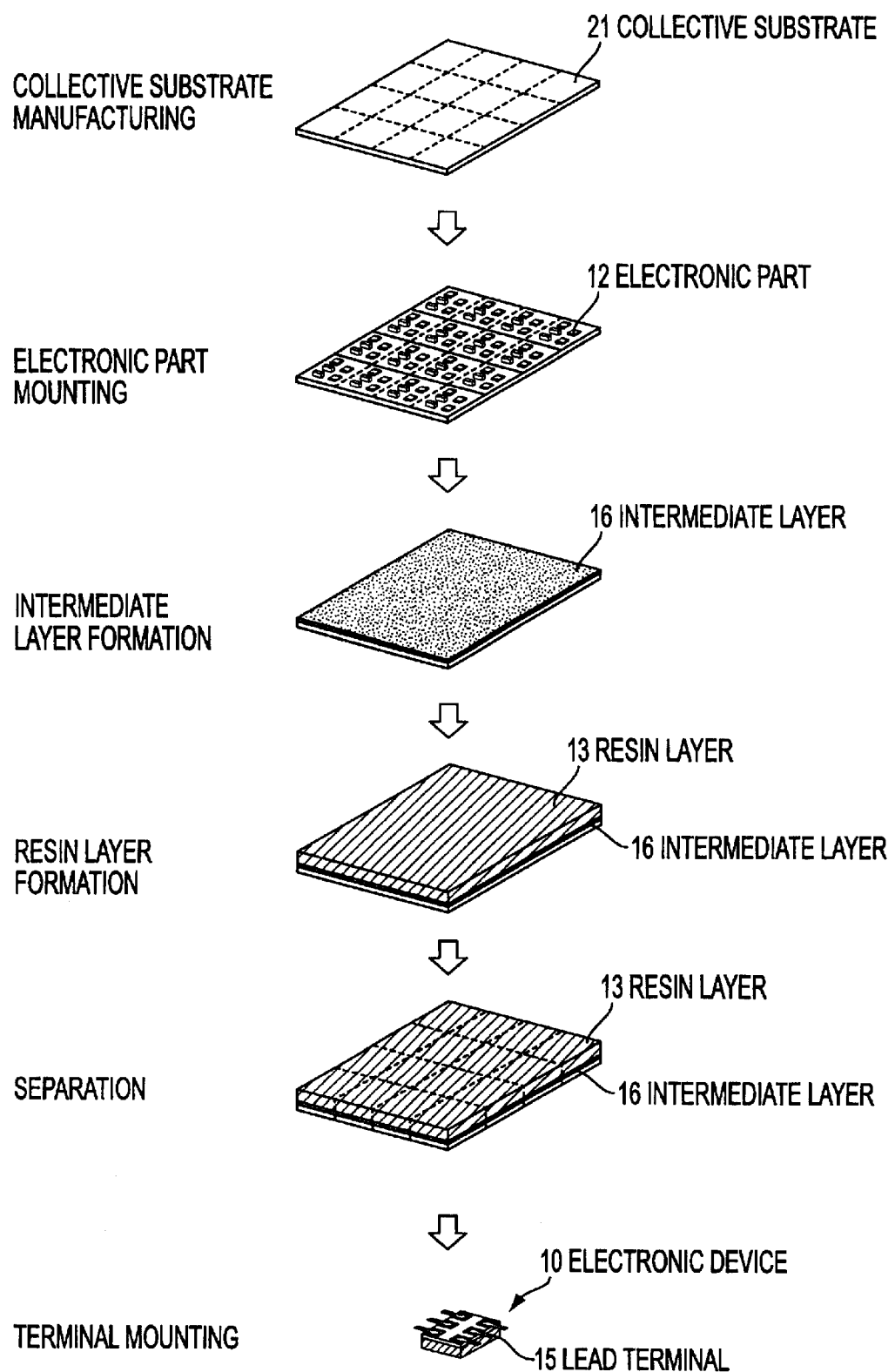
FIG. 8 is a process explanatory diagram which illustrates the method used to manufacture the above-mentioned electronic device in the second embodiment of the present invention.

Next, the method used to manufacture the above-mentioned electronic device 10 will be described with reference to the explanatory diagrams shown in FIG. 8.

First, a collective substrate 21 in which the substrates 11 of a plurality of electronic devices 10 are connected is formed (collective substrate manufacturing process). Here, a collective substrate 21 in which 16 substrates 11 are connected in the form of a 4×4 matrix is formed.

Next, after the electronic parts 12 have been mounted on the upper surface of this collective substrate 21 (electronic part mounting process), an intermediate layer 16 is formed by coating the upper surface of the collective substrate 21 with an insulating elastic material so that the electronic parts 12 are covered (intermediate layer formation process). Here, the intermediate layer 16 is applied as a coating for purposes of insulation, waterproofing and protection, and especially for the purpose of alleviating stresses generated by thermal expansion and differences in the thermal expansion coefficients of the substrate 11, solder and resin layer 13. Examples of insulating elastic materials that can be used include acrylic type, urethane type, silicone type, fluorine type, rubber type, vinyl type, polyester type, phenol type, epoxy type, and wax type coating materials, etc.

Afterward, in the same manner as in the first embodiment, the resin layer 13 is formed and the collective substrate 21 is cut using a dicing device, after which the electronic devices 10 are completed by connecting lead terminals 15.

In the electronic devices 10 thus obtained, an intermediate layer 16 consisting of an insulating elastic material is disposed between (a) the substrate 11 and electronic parts 12, and (b) the resin layer 13. Accordingly, stresses generated as a result of the thermal expansion of the substrate 11, solder and resin layer 13, and as a result of differences in the thermal expansion coefficients of these parts, can be alleviated. Specifically, during the process (reflow, etc.) in which the motherboard and electronic device 10 are connected, movement and outflow of the solder can be prevented, and the generation of cracks in the electronic parts 12 can be prevented.

Furthermore, in the intermediate layer formation process, a vacuum printing method may be used, or liquid-form elastic materials may be applied by spraying or coating with a brush, etc.

Next, a third embodiment of the present invention will be described.

Figure 9:
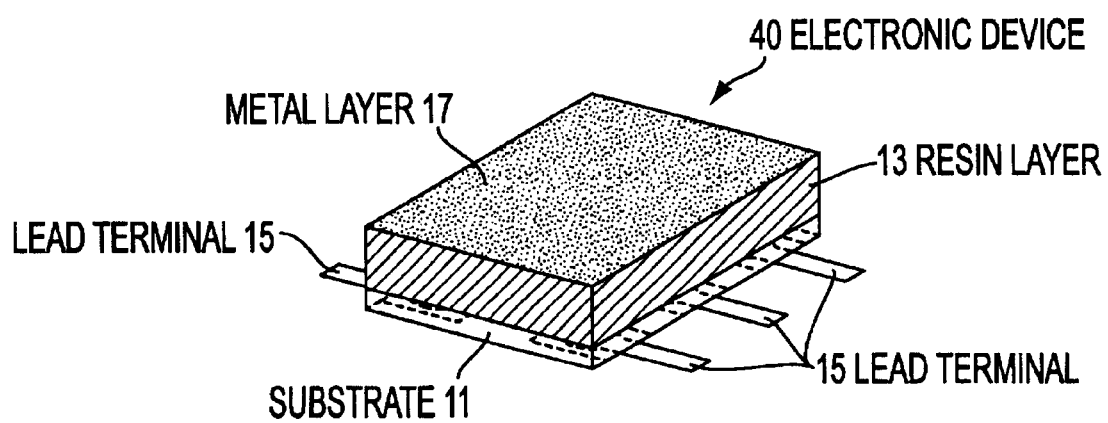
FIG. 9 is an external perspective view which illustrates an electronic device in a third embodiment of the present invention.

The manufacturing method used in this third embodiment is as follows:

FIG. 9 is an external perspective view which illustrates an electronic device 40 in the third embodiment. In this figure, constituent parts which are the same as in the aforementioned first embodiment are labeled with the same symbols, and a description of these parts is omitted. Furthermore, the main point of difference between this third embodiment and the first is that a metal layer 17 is formed on the upper surface of the resin layer 13. By thus forming a metal layer 17, it is possible to obtain an electromagnetic field shielding effect, so that an effect is exhibited in terms of EMC (electromagnetic compatibility) countermeasures.

Figure 10:
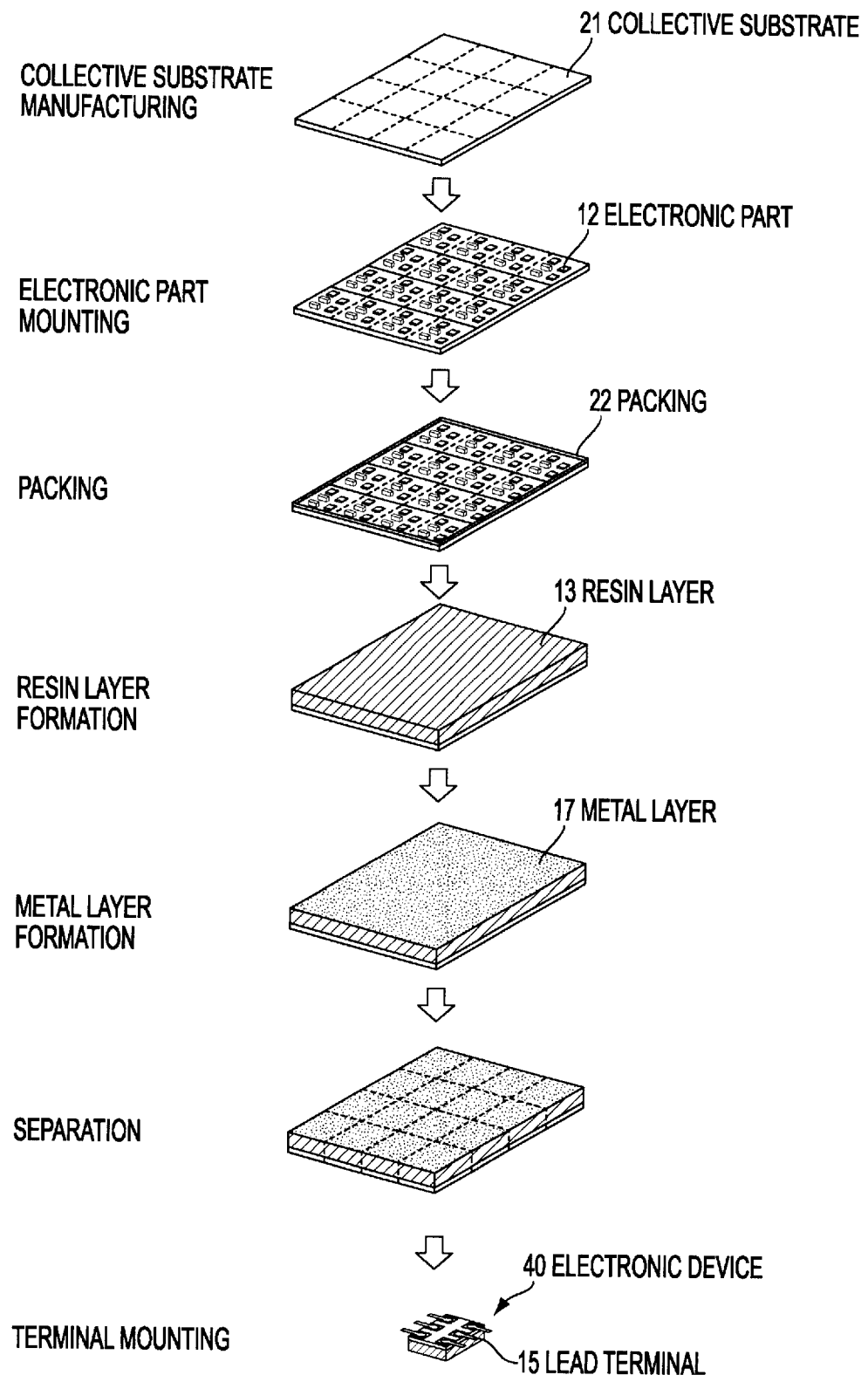
FIG. 10 is a process explanatory diagram which illustrates the method used to manufacture the above-mentioned electronic device in the third embodiment of the present invention.

The above-mentioned electronic device 40 is manufactured as follows:

Specifically, as is shown in FIG. 10, a collective substrate 21 in which the substrates 11 of a plurality of electronic devices 40 are connected is formed (collective substrate manufacturing process). After electronic parts 12 are mounted on the upper surface of the collective substrate 21 (electronic part mounting process), a packing agent 22 is applied to the upper surface of the collective substrate 21 as a coating so that this packing agent 22 covers the electronic parts 12 (packing process).

Afterward, a resin layer 13 is formed on the upper surface of the collective substrate 21 using a vacuum printing method similar to that described above (resin layer formation process).

Furthermore, a metal layer 17 is formed on the upper surface of the resin layer 13 (metal layer formation process). Here, a metal layer 17 is formed on the upper surface of the resin layer 13 by coating the upper surface of the resin layer 13 with a resin in which a metal filler is dispersed, and then curing this resin.

Next, the collective substrate 21 on which the metal layer 17 has been formed is cut using a dicing device, etc. In this case, the main bodies of the electronic devices 40 are obtained by cutting the collective substrate 21 in matrix form along the boundary lines between the individual substrates 11 (separation process). Here, the term "main body of the electronic device 40" refers to an electronic device on which lead terminals 15 have not yet been mounted.

When cutting is thus performed using a dicing device, the cut surfaces are extremely smooth surfaces, so that adjustments such as flash removal, etc., can be accomplished at the same time. Furthermore, since the resin layer 13 has waterproof properties, a wet-type cutting method can also be used.

Afterward, the lead terminals 15 are connected to the main bodies of the electronic devices 40, thus completing the electronic devices 40.

Furthermore, in the formation of the metal layer 17, it would also be possible to paste a metal film to the surface, or to use an ordinary metal film formation technique. Furthermore, a resin containing a metal filler may also be formed as a film.

Next, a fourth embodiment of the present invention will be described.

Figure 11:
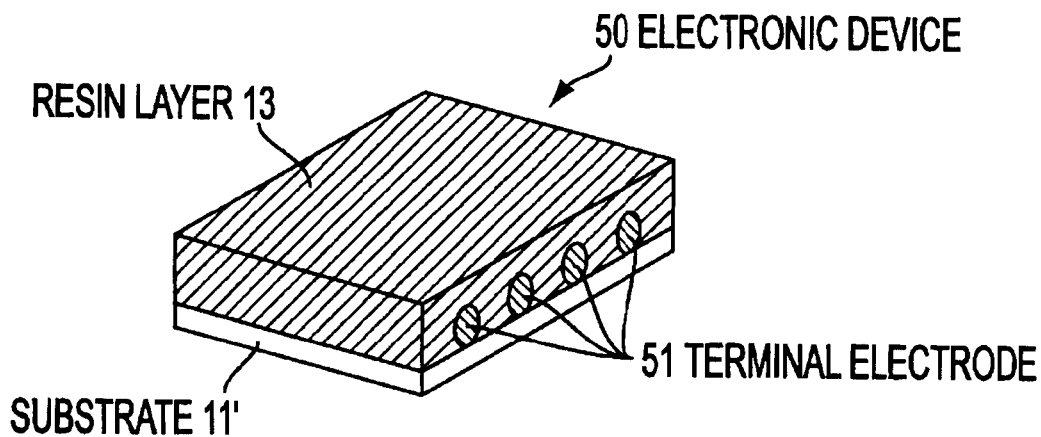
FIG. 11 is an external perspective view which illustrates an electronic device in a fourth embodiment of the present invention.
Figure 12:
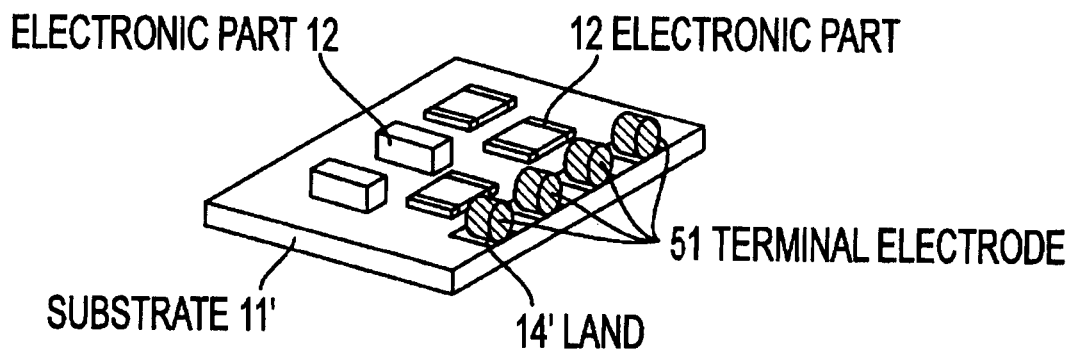
FIG. 12 is an external perspective view which shows the above-mentioned electronic device in the fourth embodiment of the present invention with the resin layer removed.

FIG. 11 is an external perspective view which illustrates an electronic device 50 in a fourth preferred embodiment. FIG. 12 is an external perspective view of the same electronic device with the resin layer removed. In the figures, constituent parts which are the same as in the aforementioned first embodiment are labeled with the same symbols, and a description of these parts is omitted. Furthermore, the main point of difference between the fourth embodiment and the first embodiment is that terminal electrodes 51 which are exposed at the side surfaces of the resin layer 13 are formed instead of the lead terminals 15 used in the first preferred embodiment.

Specifically, a substrate 11' in which no lands for the connection of lead terminals are formed on the undersurface, but in which lands 14' for the connection of terminal electrodes are formed on the upper surface (part mounting surface), is used instead of the substrate 11 used in the first embodiment Four of these lands 14' are formed along one long side of the substrate 11', and a cylindrical terminal electrode 51 is soldered to each of the lands 14'. Furthermore, one end surface of each terminal electrode 14' is positioned in the plane that includes the side surface of the substrate 11' and the side surface of the resin layer 13, so that this end surface is exposed to the outside. Here, of the four terminal electrodes 51, one electrode is used as a GND electrode, one is used as a power supply electrode, one is used as a signal input electrode, and one is used as a signal output electrode.

The electronic device 50 constructed as described above can be mounted with the side surfaces of the substrate 11' and resin layer 13 facing the motherboard, so that the required mounting area can be reduced and high-density mounting can be realized. Furthermore, as was described earlier, the mounting of the electronic device on the motherboard by means of an automatic mounting machine can also easily be accomplished. Moreover, since the terminal electrodes 51 are exposed only on one side surface of the substrate 11', the mounting direction can easily be confirmed on the basis of these exposed positions.

Next, a fifth embodiment of the present invention will be described.

Figure 13:
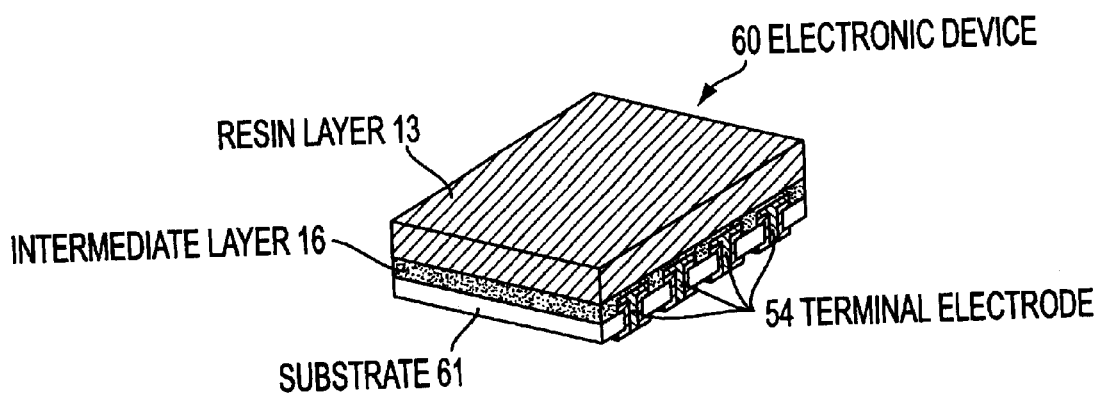
FIG. 13 is an external perspective view which illustrates an electronic device in a fifth embodiment of the present invention.
Figure 14:
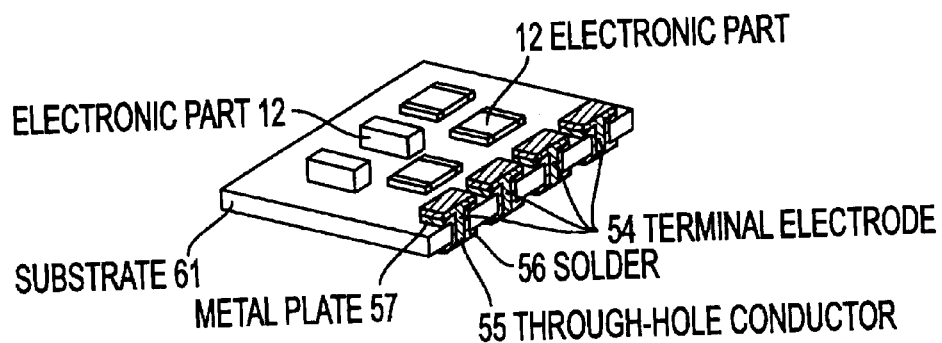
FIG. 14 is an external perspective view which shows the above-mentioned electronic device in the fifth embodiment of the present invention with the resin layer removed.

FIG. 13 is an external perspective view which illustrates an electronic device 60 in a fifth embodiment of the present invention. FIG. 14 is an external perspective view which shows the same electronic device with the intermediate layer and resin layer removed. In the figures, constituent parts which are the same as in the aforementioned fourth embodiment are labeled with the same symbols, and a description of these parts is omitted. Furthermore, the main point of difference between the fifth embodiment and the fourth embodiment is that in the fifth preferred embodiment, terminal electrodes 54 in which through-hole conductors 55 and metal plates 57 are exposed at the side surfaces of the resin layer 13 and intermediate layer 16 are installed instead of the terminal electrodes 51 used in the fourth preferred embodiment.

Specifically, a substrate 61 in which through-hole conductors 55 that are cut in half are exposed at one side surface is used instead of the substrate 11' used in the fourth preferred embodiment. Four of these through-hole conductors 55 are formed along one long side of the substrate 61, and a metal plate 57 is soldered onto the upper opening of each through-hole conductor 55 so that this plate 57 covers the opening. Furthermore, the interior of the recessed part of each through-hole conductor 55 may be filled with solder 56. Moreover, the through-hole conductors 55, solder 56 and metal plates 57 are positioned in the plane that includes the side surface of the substrate 61 and the side surfaces of the resin layer 13 and intermediate layer 16, so that said through-hole conductors, solder and metal plates are exposed to the outside. Here, of the four terminal electrodes 54, one electrode is a GND electrode, one is a power supply electrode, one is a signal input electrode, and one is a signal output electrode.

As in the case of the fourth preferred embodiment, the electronic device 60 constructed as described above can be mounted with the side surfaces of the substrate 61, resin layer 13 and intermediate layer 16 facing the motherboard, so that the required mounting area can be reduced and high-density mounting can be realized. Furthermore, as was described earlier, the mounting of the electronic device on the motherboard by means of an automatic mounting machine can also easily be accomplished. Moreover, since the terminal electrodes 54 are exposed only on one side surface of the substrate 61, the mounting direction can easily be confirmed on the basis of these exposed positions.

Next, a sixth embodiment of the present invention will be described.

Figure 15:
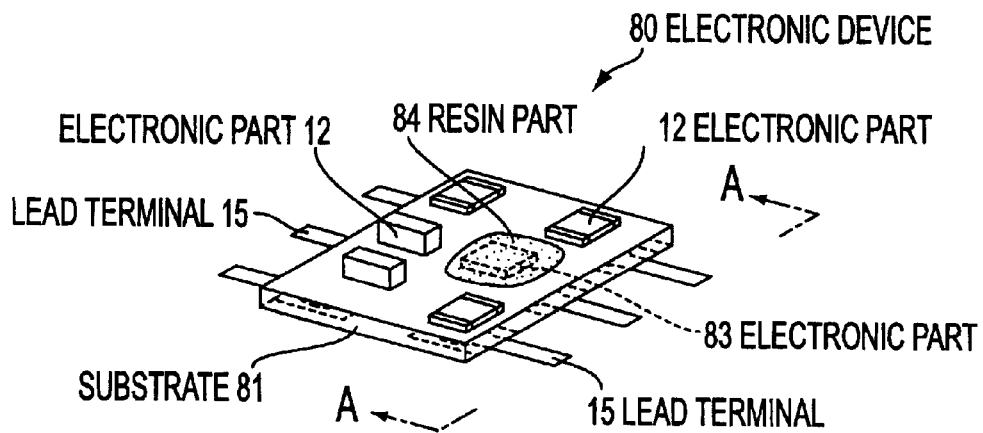
FIG. 15 is an external perspective view which illustrates an electronic device in a sixth embodiment of the present invention.
Figure 16:
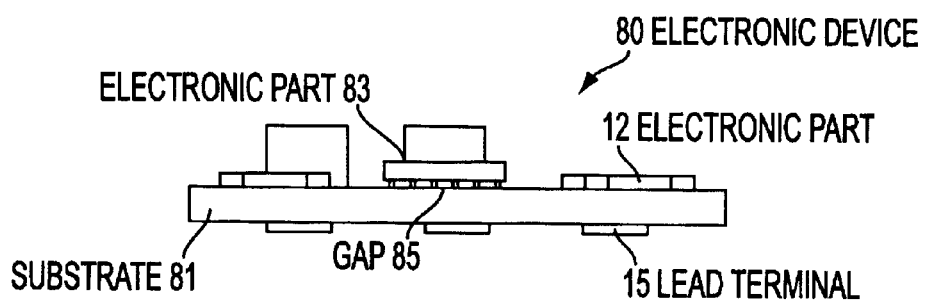
FIG. 16 is a sectional view in the direction indicated by the arrow along line A—A in FIG. 15 (with the resin part removed)
Figure 17:
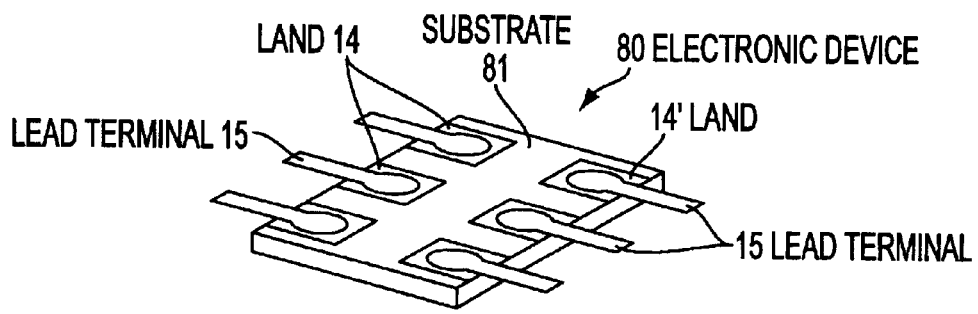
FIG. 17 is an external view which illustrates the terminal mounting surface of the electronic device in the sixth embodiment of the present invention.

FIG. 15 is an external view which illustrates an electronic device 80 in a sixth embodiment of the present invention. FIG. 16 is a side view in the direction indicated by the arrow along line A—A in FIG. 15 (with the resin part removed). FIG. 17 is an external view which shows the terminal mounting surface. In the figures, constituent parts which are the same as in the aforementioned first embodiment are labeled with the same symbols, and a description of these parts is omitted. Furthermore, the main point of difference between the sixth embodiment and the first embodiment is that in the sixth preferred embodiment, a substrate 81 on which a face-down bonding type electronic part 83 that has numerous connecting terminals is mounted is formed, and a resin part 84 is formed by filling only a specified space surrounding this electronic part 83 with a resin.

Specifically, as is shown in FIG. 16, the face-down bonding type electronic part 83 has a plurality of connecting terminals located between said electronic part 83 and the main surface of the substrate 81; accordingly, a gap 85 is formed between substrate 81 and the electronic part 83. As a result, these connecting terminals are susceptible to short-circuiting, and the mounting strength of the electronic part 83 is low. The above-mentioned resin part 84 is formed only for this electronic part 83, so that the above-mentioned short-circuiting is prevented, and the mounting strength is increased. In the present embodiment, the gap between the substrate 81 and the electronic part 83 is completely filled with the resin.

Figure 19:
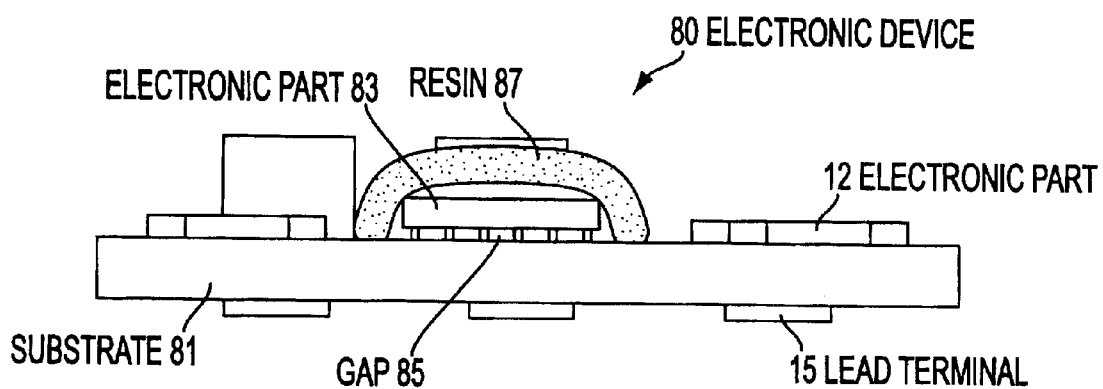
FIG. 19 is a diagram which illustrates the resin part formation method used in the sixth embodiment of the present invention.
Figure 20:
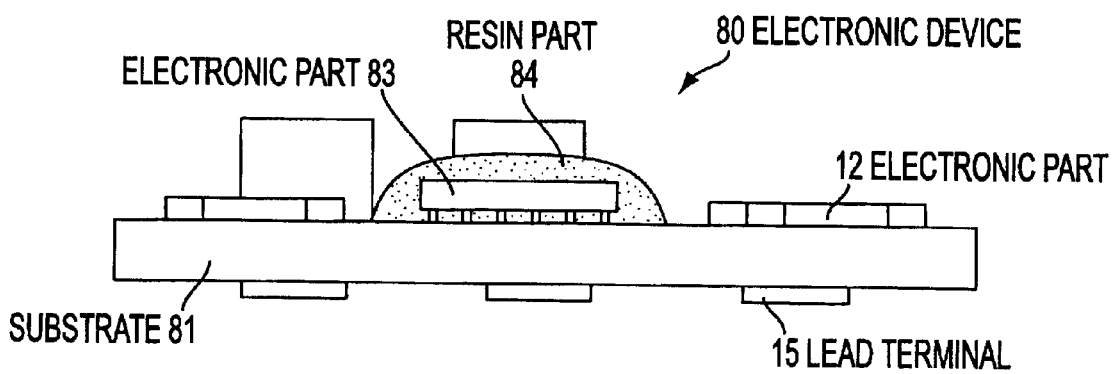
FIG. 20 is a diagram which illustrates the resin part formation method used in the sixth embodiment of the present invention.

Next, one example of a method for manufacturing the above-mentioned electronic device 80 will be described with reference to FIGS. 18 through 20.

Figure 18:
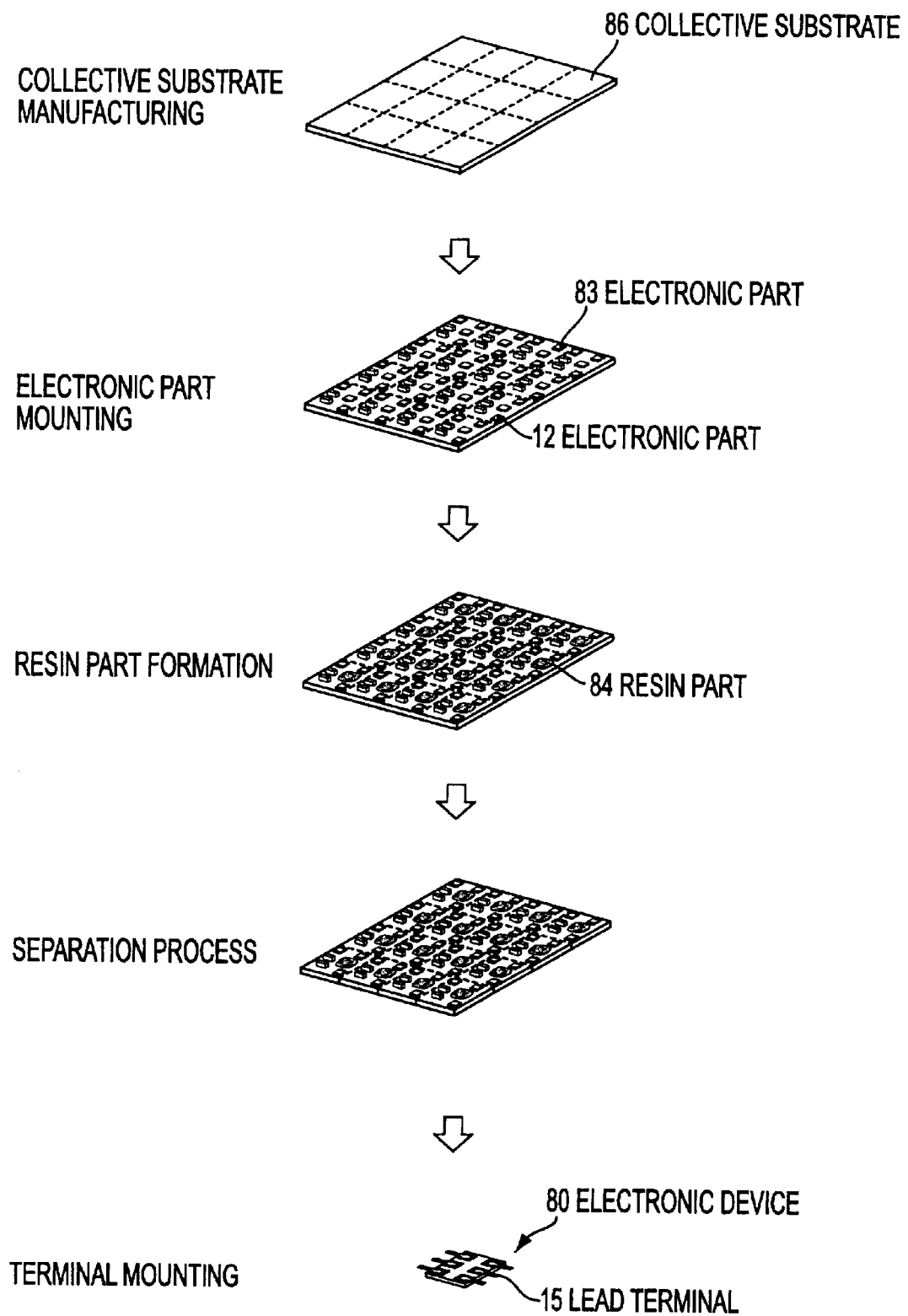
FIG. 18 is a process explanatory diagram which illustrates the method used to manufacture the above-mentioned electronic device in the sixth embodiment of the present invention.

As is shown in FIG. 18, a collective substrate 86 in which the substrates 81 of a plurality of electronic devices 80 are connected in the form of a matrix is formed (collective substrate manufacturing process), and electronic parts 12 and 83 are mounted on the upper surface of the collective substrate 86 (electronic part mounting process).

Afterward, the resin part 84 is formed in the area surrounding the electronic part 83 (resin part formation process). In this resin part formation process, as is shown in FIG. 18, the area surrounding the electronic part 83 is first placed in a vacuum state, and a resin 87 that has viscosity is disposed so that it envelops the electronic part 83. In this case, it is desirable that the resin 87 be disposed so that no gap is generated between the substrate 81 and the resin 87.

In this state, the gap 85 between the substrate 81 and the electronic part 83 is not filled with the resin 87. Furthermore, a space that is not filled with the resin 87 exists around the electronic part 83.

Next, when the surrounding area is placed in a non-vacuum state, the gap 85 and space surrounding the electronic part 83 is filled with the resin 87 as a result of the air pressure surrounding the resin 87. Afterward, the resin part 84 is formed by curing the resin 87.

Next, the collective substrate 86 on which the resin parts 84 have been formed is cut using a dicing device, etc. In this case, the main bodies of the electronic devices 80 are obtained by cutting the collective substrate 86 in matrix form along the boundary lines between the individual substrates 81 (separation process). Here, the term "main body of the electronic device 80" refers to an electronic device on which lead terminals 15 have not yet been mounted.

When cutting is thus performed using a dicing device, the cut surfaces are extremely smooth surfaces, so that adjustments such as flash removal, etc., can be accomplished at the same time. Furthermore, since the resin part 84 has waterproof properties, a wet-type cutting method can also be used.

Afterward, the electronic devices 80 are completed by connecting lead terminals 15 to the main bodies of the electronic devices 80 (terminal mounting process).

Furthermore, in cases where the resin part 84 is formed only in the area surrounding one electronic part, or in cases where the resin part 84 is formed only in a desired region by preventing the spread of the resin 87, it is desirable that a resin with a high viscosity be used as the resin 87. Furthermore, by adjusting the degree of vacuum in the resin part formation process in accordance with the viscosity of the resin 87, it is possible to achieve complete filling with the resin 87, without any gaps.

Furthermore, the formation of a metal film or metal layer, or of an electromagnetic field shielding layer, on the surface of the resin part 84 only can easily be accomplished by using a resin in which a metal filler, etc., is dispersed in the same manner as described above.

Although preferred illustrative embodiments of the present invention are described above, it will be evident to one skilled in the art that various changes and modifications may be made without departing from the invention. The respective embodiments described above are concrete examples of the present invention; the present invention is not limited to these examples alone. The present invention includes electronic devices and electronic device manufacturing methods in which the constitutions described in the above-mentioned preferred embodiments are combined or used separately. For example, in cases where the terminal electrodes are disposed as in the fourth embodiment (see FIGS. 11 and 12), it would also be possible to form a resin layer only in the areas covering the electrode terminals instead of forming a resin layer over the entire main surface of the substrate. Even in the case of such an arrangement, the electronic device can be mounted on the motherboard with the end surfaces of the electrode terminals as parts of the bottom surface. It is intended in the appended claims to cover all such changes and modifications that fall within the true spirit and scope of the invention.

Furthermore, even in cases where an electronic device on which no resin layer or resin part is formed is manufactured, the waste of substrate material can be eliminated and a reduction in cost can be achieved by using the above-mentioned manufacturing method.

In the electronic device manufacturing method of the present invention presented in paragraphs A through K of the summary of the invention above, electronic devices are obtained by using a collective substrate in which a plurality of substrates are connected in the form of a matrix, and then ultimately separating this collective substrate. Accordingly, the waste of substrate material can be greatly reduced. Furthermore, the separation of the collective substrate and adjustments such as flash removal, etc., can be simultaneously performed. Moreover, since a resin part that covers the electronic parts is formed in the state of the collective substrate, the number of steps required can be reduced compared to cases where electronic devices are manufactured using individual substrates instead of a collective substrate. Moreover, since an intermediate layer consisting of an insulating elastic material is formed, stresses generated as a result of the thermal expansion of the substrate, solder and resin layer, and as a result of differences in the thermal expansion coefficients of these parts, can be alleviated. Accordingly, during the process (reflow, etc.) in which the motherboard and electronic device are connected, the movement and outflow of solder can be prevented, and the generation of cracks in the electronic parts can be prevented. Moreover, by forming the aforementioned resin part by means of a vacuum printing method, it is possible to form the surface of the resin part as a flat surface, so that suction chucking by means of an automatic mounting machine is easy.

Furthermore, in the case of the electronic device presented in paragraphs L through S of the summary of the invention above, the manufacturing method presented in the aforementioned paragraphs A through K of the summary of the invention can easily be applied. Moreover, high-density mounting can easily be accomplished, and mounting on motherboards by means of an automatic mounting machine is also possible.

Furthermore, in the case of the resin filling method presented in paragraph T of the summary of the invention above, it is possible to fill only a specified space surrounding the desired electronic part with a resin, without forming any gaps.

We claim:
1. An electronic device comprising;
   a substrate having first and second generally planar surfaces;
   one or more electronic parts mounted on the first generally planar surface;
   a resin layer disposed to surround at least one of the one or more electronic parts;
   an intermediate layer comprising an insulating elastic material interposed between the resin layer and the first generally planar surface; and
   a plurality of terminal electrodes electrically coupled to the one or more electronic parts.
2. The electronic device of claim 1, wherein the substrate comprises a rectangular solid of a specified thickness.
3. The electronic device of claim 1, wherein the resin layer comprises a rectangular solid of a specified thickness, the resin layer disposed over the first generally planar surface.
4. The electronic device of claim 1, wherein the resin layer comprises a plurality of resin side surfaces orthogonal to the first generally planar surface, the plurality of terminal electrodes embedded in the resin layer so that each of the plurality of terminal electrodes are disposed flush with one of the plurality of resin side surfaces.

5. The electronic device of claim 1, wherein the substrate further comprises a plurality of substrate side surfaces orthogonal to the first generally planar surface, wherein the plurality of terminal electrodes are embedded in the substrate so that each of the plurality of terminal electrodes are disposed flush with one of the plurality of substrate side surfaces.

6. The electronic device of claim 1, wherein the resin layer comprises a ferrite filler or a metal filler.

7. The electronic device of claim 1, wherein the resin layer comprises at least one of the following properties: insulation, heat resistance, fluid impermeability or chemical resistance.

8. The electronic device of claim 1, wherein the electronic device comprises at least one layer selected from the group consisting of: an electromagnetic field shielding layer, a heat-dissipating layer or a metal layer wherein the at least one layer is disposed on at least a specified region of the resin layer.

* * * * *